US008890359B2

(12) United States Patent
Chang

(10) Patent No.: US 8,890,359 B2
(45) Date of Patent: Nov. 18, 2014

(54) POWER SUPPLY SYSTEM AND CONTAINER DATA CENTER INCLUDING SAME

(75) Inventor: Yao-Ting Chang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 1006 days.

(21) Appl. No.: 12/915,074

(22) Filed: Oct. 29, 2010

(65) Prior Publication Data

US 2012/0069512 A1  Mar. 22, 2012

(30) Foreign Application Priority Data

Sep. 17, 2010  (TW) ................ 99131538 A

(51) Int. Cl.
| H05K 7/14 | (2006.01) |
| G06F 1/26 | (2006.01) |
| G06F 1/30 | (2006.01) |
| H02J 9/06 | (2006.01) |
| H02J 3/38 | (2006.01) |

(52) U.S. Cl.
CPC .............. *H02J 9/062* (2013.01); *Y02E 10/566* (2013.01); *Y02E 10/563* (2013.01); *H05K 7/1492* (2013.01); *G06F 1/263* (2013.01); *G06F 1/305* (2013.01); *Y02B 10/72* (2013.01); *H02J 3/383* (2013.01)
USPC ........................... 307/43; 307/64; 361/679.31

(58) Field of Classification Search
CPC combination set(s) only.
See application file for complete search history.

(56) References Cited

U.S. PATENT DOCUMENTS

| 4,421,943 | A | * | 12/1983 | Withjack ................ 136/246 |
| 4,707,618 | A | * | 11/1987 | Haas ..................... 307/64 |
| 4,725,740 | A | * | 2/1988 | Nakata .................... 307/64 |
| 4,782,241 | A | * | 11/1988 | Baker et al. ............. 307/66 |
| 5,081,367 | A | * | 1/1992 | Smith et al. .............. 307/64 |
| 5,384,792 | A | * | 1/1995 | Hirachi .................. 714/14 |
| 5,612,580 | A | * | 3/1997 | Janonis et al. ............. 307/64 |
| 5,923,158 | A | * | 7/1999 | Kurokami et al. ........... 323/299 |
| 5,929,538 | A | * | 7/1999 | O'Sullivan et al. ......... 307/66 |
| 5,969,501 | A | * | 10/1999 | Glidden et al. ............. 320/101 |
| 6,046,919 | A | * | 4/2000 | Madenokouji et al. ....... 363/98 |
| 6,201,319 | B1 | * | 3/2001 | Simonelli et al. ........... 307/26 |
| 6,201,371 | B1 | * | 3/2001 | Kawabe et al. ............ 320/121 |
| 6,384,570 | B2 | * | 5/2002 | Matsuyama ............... 320/101 |
| 6,590,793 | B1 | * | 7/2003 | Nagao et al. ............... 363/95 |
| 6,691,248 | B1 | * | 2/2004 | Nishijima et al. ........... 714/14 |
| 6,806,684 | B2 | * | 10/2004 | Matsuyama ............... 320/112 |
| 6,949,843 | B2 | * | 9/2005 | Dubovsky ................ 307/64 |
| 6,972,689 | B1 | * | 12/2005 | Morgan et al. ............. 340/815.4 |
| 7,495,415 | B2 | * | 2/2009 | Kanouda et al. ............ 320/112 |
| 7,525,207 | B2 | * | 4/2009 | Clidaras et al. ............. 290/43 |
| 7,560,831 | B2 | * | 7/2009 | Whitted et al. ............. 307/64 |
| 7,724,513 | B2 | * | 5/2010 | Coglitore et al. ........ 361/679.47 |

(Continued)

FOREIGN PATENT DOCUMENTS

CN         101412376 A     4/2009

*Primary Examiner* — Rexford Barnie
*Assistant Examiner* — Elim Ortiz
(74) *Attorney, Agent, or Firm* — Novak Druce Connolly Bove + Quigg LLP

(57) ABSTRACT

A power supply system provides power to a container data center. The power supply system includes a solar energy panel, to receive solar energy and output a direct current (DC) voltage. A direct current to alternating current (DC/AC) voltage converting unit is connected to the solar energy panel, to receive the DC voltage from the solar energy panel and converts the received DC voltages to an AC voltage, and outputs the converted AC voltage to the container data center.

2 Claims, 2 Drawing Sheets

(56) References Cited

U.S. PATENT DOCUMENTS

| | | | |
|---|---|---|---|
| 7,795,837 B1* | 9/2010 | Haun et al. ................... 320/101 |
| 8,080,900 B2* | 12/2011 | Corhodzic et al. ............. 307/66 |
| 8,203,235 B2* | 6/2012 | Fox et al. ....................... 307/64 |
| 8,392,574 B1* | 3/2013 | Shah et al. ................... 709/226 |
| 8,434,804 B2* | 5/2013 | Slessman .................... 296/24.3 |
| 8,463,449 B2* | 6/2013 | Sanders ........................ 700/286 |
| 8,471,402 B2* | 6/2013 | Chang et al. ................... 307/43 |
| 2004/0150374 A1* | 8/2004 | Kraus ................................ 322/4 |
| 2005/0036248 A1* | 2/2005 | Klikic et al. .................... 361/42 |
| 2005/0099750 A1* | 5/2005 | Takahashi et al. ............. 361/92 |
| 2006/0082263 A1* | 4/2006 | Rimler et al. ................ 312/201 |
| 2007/0278860 A1* | 12/2007 | Krieger et al. ................. 307/64 |
| 2008/0030078 A1* | 2/2008 | Whitted et al. ................. 307/66 |
| 2008/0123288 A1* | 5/2008 | Hillis ............................ 361/687 |
| 2008/0211452 A1* | 9/2008 | Blackman .................... 320/101 |
| 2008/0258470 A1* | 10/2008 | Khoo et al. ................... 290/1 A |
| 2009/0050591 A1* | 2/2009 | Hart et al. .................... 211/162 |
| 2009/0078401 A1* | 3/2009 | Cichanowicz ................. 165/299 |
| 2009/0079161 A1* | 3/2009 | Muchow et al. ............... 280/400 |
| 2009/0251860 A1* | 10/2009 | Belady et al. ................. 361/690 |
| 2010/0109910 A1* | 5/2010 | Fahey ............................ 340/908 |
| 2010/0125383 A1* | 5/2010 | Caouette ......................... 701/21 |
| 2010/0156185 A1* | 6/2010 | Kim et al. ....................... 307/72 |
| 2010/0223858 A1* | 9/2010 | Billings ......................... 52/79.1 |
| 2010/0244450 A1* | 9/2010 | Tabe ............................... 290/53 |
| 2011/0049992 A1* | 3/2011 | Sant'Anselmo et al. ....... 307/64 |
| 2011/0316298 A1* | 12/2011 | Rampersad ..................... 296/21 |
| 2012/0013188 A1* | 1/2012 | Chang et al. ................... 307/48 |
| 2012/0013195 A1* | 1/2012 | Chang et al. ................... 307/82 |
| 2012/0069512 A1* | 3/2012 | Chang ...................... 361/679.31 |
| 2012/0150679 A1* | 6/2012 | Lazaris ......................... 705/26.2 |
| 2012/0326444 A1* | 12/2012 | Chang ............................ 290/52 |
| 2012/0326653 A1* | 12/2012 | Godrich et al. ............... 320/101 |
| 2012/0327592 A1* | 12/2012 | Godrich et al. .......... 361/679.48 |
| 2013/0058029 A1* | 3/2013 | Ootani et al. ............ 361/679.31 |
| 2013/0213038 A1* | 8/2013 | Lazaris ........................ 60/641.8 |

* cited by examiner

POWER SUPPLY SYSTEM AND CONTAINER DATA CENTER INCLUDING SAME

BACKGROUND

1. Technical Field

The present disclosure relates to a power supply system and a container data center including the power supply system.

2. Description of Related Art

Electricity is wasted during the inefficient transmission of commercial power to a container data center. Therefore there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings, is illustrated by way of example and not by limitation. It should be noted that references to "an" or "one" embodiment in this disclosure are not necessarily to the same embodiment, and such references mean at least one.

Figure 1:
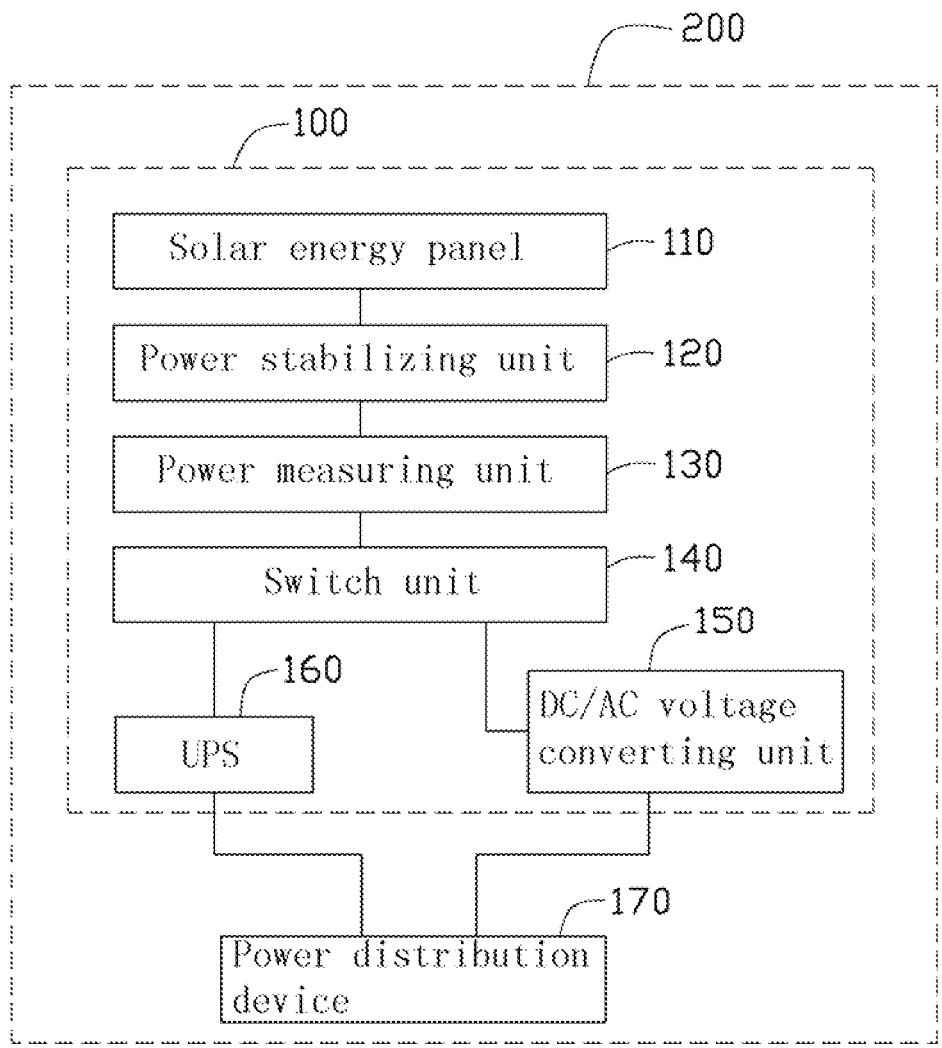
FIG. 1 is a block diagram of an exemplary embodiment of a container data center.
Figure 2:
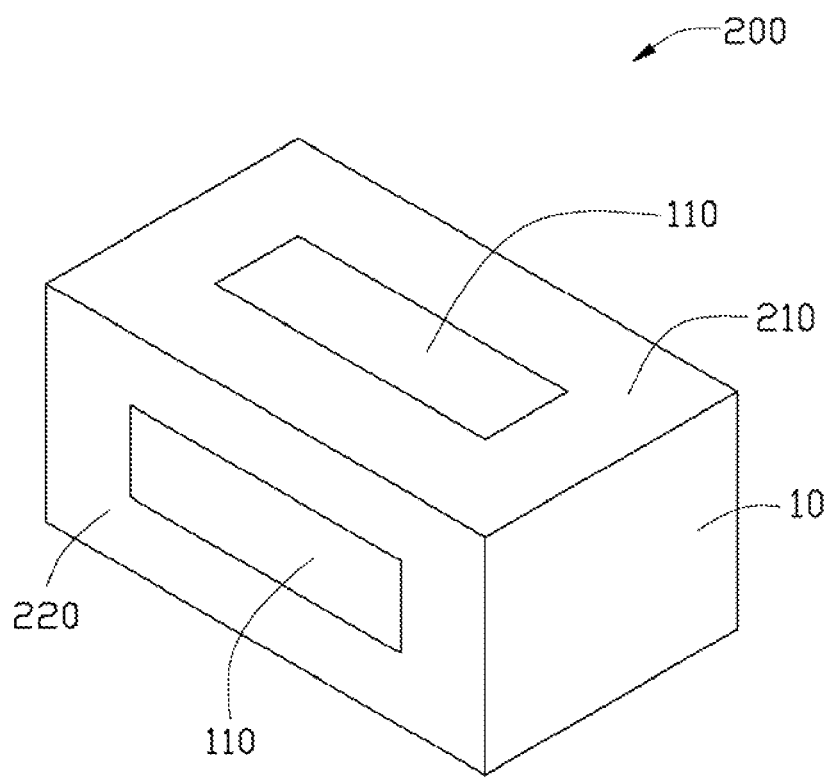
FIG. 2 is a schematic diagram of the container data center of FIG. 1.

Referring to FIGS. 1 and 2, a power supply system 100 is used for providing power to a container data center 200. The container data center 200 includes a power distribution device 170, a portable container 10, and a plurality of server systems (not shown) installed in the container 10. The container 10 includes a top wall 210, and opposite sides walls 220 extending down from opposite sides of the top wall 210. An embodiment of the power supply system 100 includes a plurality of solar energy panels 110, a power stabilizing unit 120, a power measuring unit 130, a switch unit 140, a direct current to alternating current (DC/AC) voltage converting unit 150, and an uninterruptible power supply (UPS) 160. The power stabilizing unit 120, the power measuring unit 130, the switch unit 140, the DC/AC voltage converting unit 150, and the UPS 160 are arranged in the container 10.

The solar energy panels 110 are positioned on the top wall 210 and the side walls 220 of the container 10 to take advantage of any exposure to the sun and receive solar energy, and output a direct current (DC) voltage to the power stabilizing unit 120.

The solar energy panels 110 are connected to the power stabilizing unit 120. The power stabilizing unit 120 is connected to the power measuring unit 130. The power measuring unit 130 is connected to the switch unit 140. The switch unit 140 is connected to the UPS 160 and the DC/AC voltage converting unit 150. The UPS 160 and the DC/AC voltage converting unit 150 are connected to the power distribution device 170.

The power stabilizing unit 120 is configured to stabilize the DC voltage output from the solar energy panels 110. Because the DC voltage output from the solar energy panels 110 may fluctuate due to the amount of direct sunlight on the panels.

The power measuring unit 130 is configured to compare the received DC voltage from the power stabilizing unit 120 with a reference voltage, which is preset in the power measuring unit 130, to determine whether there is enough energy generated by the solar energy panels 110 to power the container data center 200. When the received DC voltage of the power measuring unit 130 is greater than or equal to the reference voltage, the solar energy panels 110 can provide enough power to the container data center 200. At this time, the power measuring unit 130 outputs a first control signal to the switch unit 140, to control the switch unit 140 to be in a first work state. The power measuring unit 130 outputs the converted DC voltage to the DC/AC voltage converting unit 150 through the switch unit 140, then the DC/AC voltage converting unit 150 converts the DC voltage to an AC voltage and supplies the AC voltage to the power distribution device 170. When the received DC voltage of the power measuring unit 130 is less than the reference voltage, then the solar energy panels 110 cannot provide enough power to the container data center 200. At such time, the power measuring unit 130 outputs a second control signal to the switch unit 140, to control the switch unit 140 to be in a second work state. Any available power from the solar energy panels is diverted to the UPS 160 through the switch unit 140, thereby charging the UPS 160. At this time the UPS 160 provides enough power as an AC voltage to the power distribution device 170 to operate the data center 200.

The power distribution device 170 outputs the converted AC voltage from the DC/AC voltage converting unit 150 to the container data center 200 or the power distribution device 170 outputs AC voltage from the UPS 160 to the container data center 200.

In other embodiments, the power measuring unit 130, the switch unit 140, and the UPS 160 can be omitted when there is enough energy generated by the solar energy panels 110 to power the container data center 200. Namely, the power stabilizing unit 120 is connected to the DC/AC voltage converting unit 150. The DC/AC voltage converting unit 150 converts the received DC voltage output from the power stabilizing unit 120 to an AC voltage and outputs the converted AC voltage to the container data center 200. Also, the power stabilizing unit 120 also can be omitted to save cost.

The power supply system 100 can use solar energy to power the container data center 200 and keep the UPS 160 charged. Therefore, the data center 200 is not dependent on commercial power and electricity is saved.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A power supply system to provide a voltage for a container data center, the power supply system comprising:
   at least one solar energy panel, to receive solar energy and output a direct current (DC) voltage;
   a power measuring unit connected to the at least one solar energy panel, to compare the received DC voltage from the at least one solar energy panel with a reference voltage preset in the power measuring unit, thereby to determine whether there is enough energy generated by the solar energy panel to power the container data center;

a switch unit connected to the power measuring unit, wherein the power measuring unit outputs a first control signal to control the switch unit to be in a first work state or outputs a second control signal to control the switch unit to be in a second work state according to a compared result of the power measuring unit;

an uninterrupted power supply (UPS) connected between a power distribution device of the container data center and the switch unit; and a direct current to alternating current (DC/AC) voltage converting unit connected between the power distribution device and the switch unit, to convert the received DC voltage to an AC voltage and output the converted AC voltage to the power distribution device;

wherein when the received DC voltage is greater than or equal to the reference voltage, the power measuring unit outputs the first control signal to control the switch unit to be in the first work state and outputs the received DC voltage to the DC/AC voltage converting unit through the switch unit; wherein when the received DC voltage is less than the reference voltage, the power measuring unit outputs the second control signal to control the switch unit to be in the second work state and outputs the received DC voltage to charge the UPS through the switch unit; and wherein the power distribution device receives the AC voltage from the DC/AC voltage converting unit and outputs the received AC voltage to the container data center, wherein the power distribution device receives the AC voltage from the UPS and outputs the received AC voltage to the container data center when the power distribution device does not receive the AC voltage from the DC/AC voltage converting unit.

2. The power supply system of claim 1, further comprising a power stabilizing unit connected to the at least one solar energy panel, to stabilize the DC voltage output from the at least one solar energy panel.

* * * * *